(12) United States Patent
Hagiwara et al.

(10) Patent No.: US 7,927,769 B2
(45) Date of Patent: Apr. 19, 2011

(54) METHOD FOR FABRICATING EUVL MASK

(75) Inventors: Ryoji Hagiwara, Chiba (JP); Osamu Takaoka, Chiba (JP); Tomokazu Kozakai, Chiba (JP)

(73) Assignee: SII Nanotechnology Inc. (JP)

( * ) Notice: Subject to any disclaimer, the term of this patent is extended or adjusted under 35 U.S.C. 154(b) by 93 days.

(21) Appl. No.: 12/380,872

(22) Filed: Mar. 3, 2009

(65) Prior Publication Data

US 2009/0226825 A1    Sep. 10, 2009

(30) Foreign Application Priority Data

Mar. 4, 2008  (JP) .................................. 2008-053592

(51) Int. Cl.
*G03F 1/00*   (2006.01)

(52) U.S. Cl. ......................................................... 430/5
(58) Field of Classification Search ................ 430/5, 30; 250/492.2, 492.21, 492.3
See application file for complete search history.

(56) References Cited

U.S. PATENT DOCUMENTS 6,440,615 B1 * 8/2002 Shimizu ........................... 430/5
* cited by examiner

*Primary Examiner* — Stephen Rosasco
(74) *Attorney, Agent, or Firm* — Adams & Wilks

(57) ABSTRACT

A method for fabricating an extreme ultraviolet lithography (EUVL) mask. In an etching step, at least a part of an absorption layer of an EUVL mask is etched by allowing a charged particle to irradiate the absorption layer under feed of a halogenated xenon gas. In an oxidant feed step, an oxidant is fed to the absorption layer after the etching step to form an oxidized layer at a side surface of the absorption layer that is not etched during the etching step.

11 Claims, 6 Drawing Sheets

METHOD FOR FABRICATING EUVL MASK

BACKGROUND OF THE INVENTION

1. Field of the Invention

The present invention relates to a method for fabricating an EUVL mask.

2. Description of the Related Art

For highly densified semiconductor devices, it is inevitable to prepare an exposure light source with a short wavelength. Therefore, an extreme ultra violet lithography (EUVL) using an extreme ultraviolet beam of a wavelength of 13.5 nm has been developed. Currently, not any lens exists, through which the EUV beam can transmit. Accordingly, the EUVL mask reflects the EUV beam for resist exposure. Specifically, EUVL mask 50 shown in FIG. 7B is a reflection-type mask while conventional photomasks are transmission-type masks. The glass substrate of such photomasks corresponds to reflection layer 52 of the EUVL mask 50, while the shield layer of the photomasks corresponds to absorption layer 56 and oxidized layer 58 of the EUVL mask 50. In the EUVL mask 50, a Mo/Si multilayer film is used as the reflection layer 52 while a Ta compound such as TaBN is used as the absorption layer 56. Between the reflection layer 52 and the absorption layer 56, Si capping layer 54a and buffer layer 54b made of CrN are formed.

FIGS. 7A and 7B are explanatory views of a conventional black defect repairing technique, where FIG. 7A is a partial plane view and FIG. 7B is a side cross-sectional view of FIG. 7A along the line B-B. As shown in FIG. 7A, the absorption layer 56 and the oxidized layer 58 are forced out from the designated pattern in the EUVL mask 50, so that black defect 60 may sometimes be formed eventually. Using such EUVL mask for lithography, the EUV beam cannot be reflected on the black defect 60. Hence, the pattern on an exposed wafer is shifted from the designed value, leading to the deterioration or poor performance of the device profile. When the shift is large, electrical wiring may fall into a short circuit or may come down. So as to avoid such events, JP-A-2005-260057 (patent reference 1) discloses a technique for repairing the black defect on an EUVL mask. The technique for repairing such black defect includes allowing an ion beam to selectively irradiate the black defect under feed of an etching gas such as xenon fluoride from a gas gun. By this technique, over-etching into the Mo/Si multilayer film can be progressed at a minimum, owing to the effect of the halogen-series assist gas on the rate enhancement.

In a course of eliminating the black defect 60 with a halogenated xenon, however, the absorption layer 56 is etched isotropically as shown in FIGS. 7A and 7B. Due to the isotropic etching, the side face of the absorption layer 56 is side etched, disadvantageously leading to a problem of the reduction of the pattern precision of the absorption layer 56. On the side-etched part 57 of the absorption layer 56, the absorption profile of the EUV beam is deteriorated. When lithography is done using the EUVL mask, the pattern on an exposed wafer is shifted from the designed value, leading to the occurrence of the deterioration or poor performance of the device profile.

In view of such problems, the invention has been achieved. It is an object of the invention to provide a method for fabricating an EUVL mask, which is capable of fabricating the pattern of the absorption layer of the EUVL mask at a high precision.

SUMMARY OF THE INVENTION

In order to solve the problems, the method for fabricating an EUVL mask in accordance with the invention is a method for fabricating an EUVL mask including an etching step of etching at least a part of the absorption layer of an EUVL mask by allowing a charged particle beam to irradiate the absorption layer under feed of a halogenated xenon gas, wherein the method further includes an oxidant feed step of feeding an oxidant to the absorption layer after the etching step and the etching step and the oxidant feed step are alternately carried out at plural times.

On the side face of the absorption layer as freshly exposed at the etching step, in accordance with the invention, a side face-oxidized layer can be formed at the oxidant feed step. Herein, the halogenated xenon gas has an etching selectivity for the absorption layer and oxidized layer of the EUVL mask. While the chemical etching with the halogenated xenon gas is isotropic etching, the physical etching with the charged particle beam is anisotropic etching and the anisotropic etching is overwhelming in total. At the next etching step, hence, the upper face of the absorption layer can be etched while the side face-oxidized layer of the absorption layer is retained. By carrying out the etching step and the oxidant feed step alternately at plural times, the time for single etching step can be shortened. Due to the procedure, the side face of the absorption layer as freshly exposed at each etching step can be etched at minimum. In such manner, the side etching of the absorption layer can be suppressed, so that the pattern of the absorption layer can be fabricated at a high precision.

Further, the oxidant is preferably water.

In accordance with the invention, a side face-oxidized layer can be formed on the absorption layer in a secure manner. At the etching step and the oxidant feed step, a halogenated xenon gas and water, respectively can be fed separately. Therefore, the decomposition of such halogenated xenon gas with water can be prevented.

Additionally, the method for fabricating an EUVL mask in accordance with the invention is a method for fabricating an EUVL mask including an etching step of etching at least a part of the absorption layer of an EUVL mask by allowing charged particle beam to irradiate the absorption layer under feed of a halogenated xenon gas, wherein an oxidant is fed together with the halogenated xenon gas at the etching step.

In accordance with the invention, the etching of the upper face of the absorption layer can be progressed while the side face-oxidized layer is formed on the side face of the absorption layer as freshly exposed. Specifically, the side face of the absorption layer can be protected constantly with such oxidized layer, to securely prevent the side etching of the absorption layer. In such manner, the pattern of the absorption layer can be fabricated at an extremely high precision.

Meanwhile, the oxidant is preferably ozone gas.

In accordance with the invention, a side face-oxidized layer can be formed on the absorption layer in a secure manner. Compared with the case of alternately feeding the halogenated xenon gas and the oxidant, the fabrication step can be simplified.

According to the method for fabricating an EUVl mask in accordance with the invention, the side etching of the absorption layer can be suppressed by etching the upper face of the absorption layer while forming the side face-oxidized layer of the absorption layer, so that the pattern of the absorption layer can be fabricated at a high precision.

DESCRIPTION OF THE PREFERRED EMBODIMENTS

Figure 1:
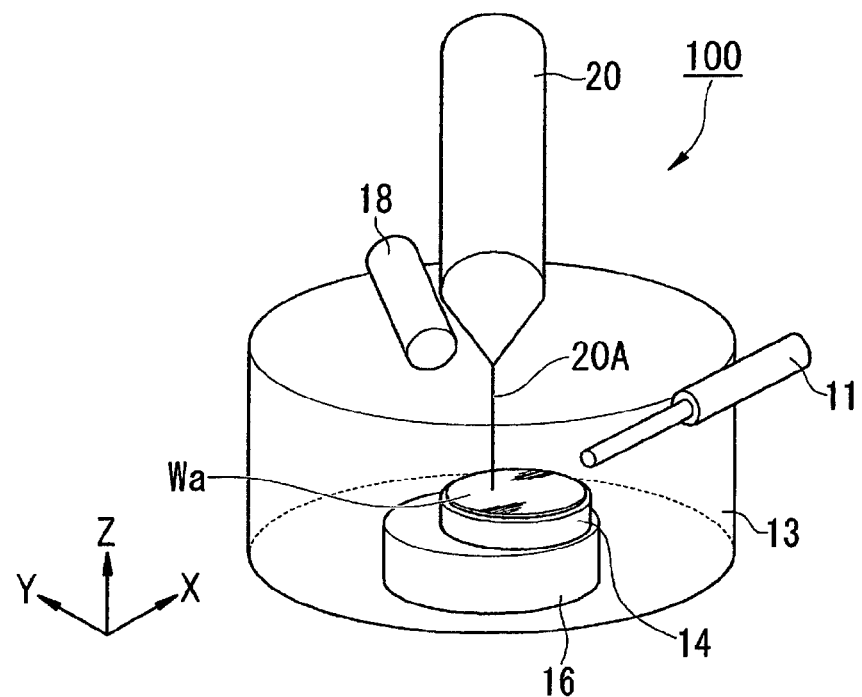
FIG. 1 is a schematic perspective view showing the outline of the mask fabrication apparatus.
Figure 2:
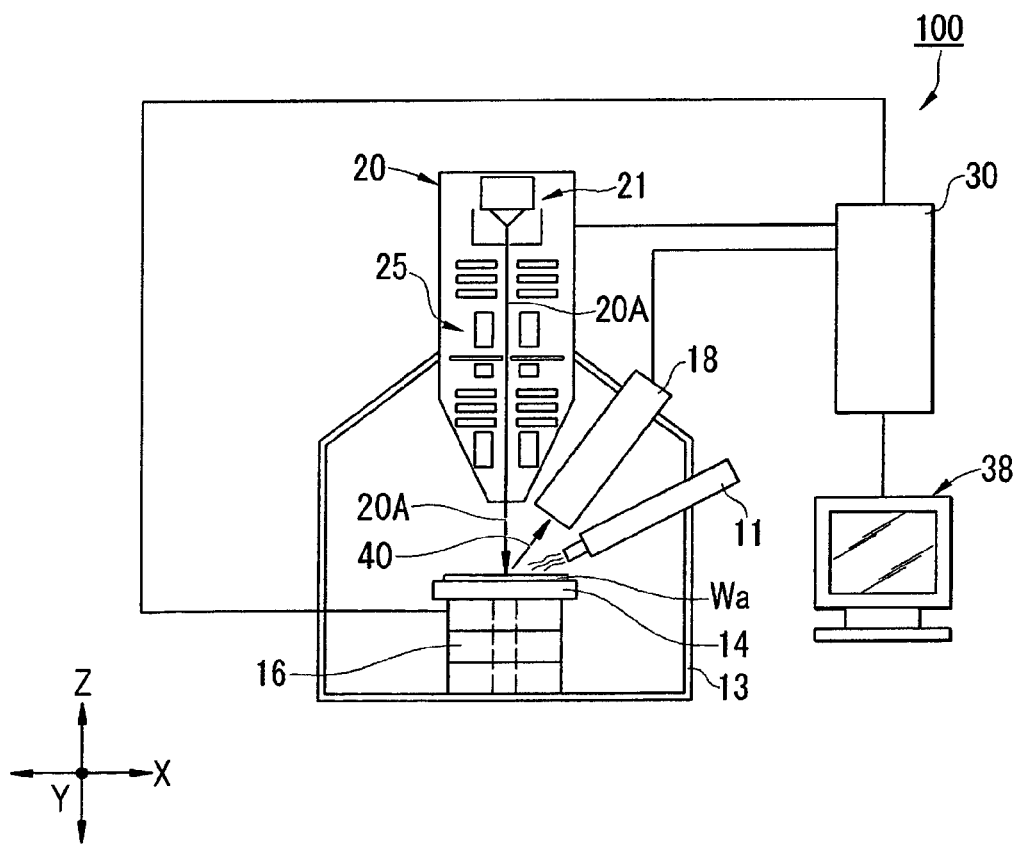
FIG. 2 is a schematic cross-sectional view showing the outline of the mask fabrication apparatus.

Embodiments of the invention are now described with reference to attached drawings.
Apparatus for Fabricating Mask FIG. 1 is a schematic perspective view showing the outline of the mask fabrication apparatus. FIG. 2 is a cross sectional view thereof. As shown in FIGS. 1 and 2, mask fabrication apparatus 100 in the present embodiment allows for the irradiation of focused ion beam (FIB) on a mask for repairing a mask defect and includes ion beam irradiation system 20, sample stage 16, vacuum chamber 13, secondary charged particle detector 18 and gas gun 11. The pressure in the inside of the vacuum chamber 13 can be reduced to a given vacuum level, and the individual constitution members described above are partially or wholly placed in the vacuum chamber 13. The sample stage 16 supports sample table 14 for mounting sample Wa in a movable manner along the two axes of x and y.

As shown in FIG. 1, the ion beam irradiation system 20 is equipped with a focused ion beam lens tube, through which ion beam 20A irradiates the sample Wa mounted on the samples stage 16 arranged in the vacuum chamber 13. The sample Wa includes an EUVL mask as a repair subject.

As shown in FIG. 2, the ion beam irradiation system 20 is configured to include ion source 21 generating ion and making the ion flowing out, and ion optical system 25 for forming ion beam 20A as a focused ion beam from the ion flowing out from the ion source 21.

The ion source 21 is for example liquid gallium, where a filament not shown in the figure is arranged and connected with a filament electric source. Therefore, the ion source 21 is retained constantly at a liquid state under heating with the filament so that the ion source 21 is at a gallium ion (Ga+)-releasable state owing to the potential difference occurring therearound.

The ion optical system 25 includes for example a condenser lens focusing ion beam, an aperture controlling ion beam, an aligner adjusting the optical axis of ion beam, an object lens focusing ion beam toward a sample, and a polarizer scanning ion beam on the sample, in the order along the direction from the side of the ion source 21 to the side of the vacuum chamber 13.

In the vacuum chamber 13, additionally, secondary charged particle detector 18 and gas gun 11 are arranged.

The secondary charged particle detector 18 detects secondary electrons and secondary ions from the sample Wa on the irradiation of ion beam 20A from the ion beam irradiation system 20 to the sample Wa.

The gas gun 11 feeds an etching assist gas for enhancing the etching rate of etching with ion beam 20A, a gas for use in deposition as the raw material for the absorption layer for repairing white defect, the oxidant gas described below, and the like, simultaneously or sequentially to the sample Wa. Depending on the type of a defect to be repaired, the gas type may appropriately be selected for each step.

Gas assist etching can be done by allowing the ion beam 20A to irradiate the sample Wa under feed of an etching assist gas from the gas gun 11. In such manner, the etching velocity (etching rate) of the sample Wa can be raised, compared with the case of physical sputtering with the ion beam 20A.

Additionally, gas assist deposition can be done by allowing the ion beam 20A to irradiate the sample Wa under feed of a gas for use in deposition from the gas gun 11. In such manner, a deposit or a film made of a metal or an insulation material can be formed on the sample Wa.

Further, the mask fabrication apparatus 100 is equipped with control unit 30 controlling the individual members composing the apparatus. The control unit 30 is in electric connection with the ion beam irradiation system 20, the secondary charged particle detector 18, and the sample stage 16. The control unit 30 is additionally equipped with display unit 38 displaying the image of the sample Wa as based on the output from the secondary charged particle detector 18.

The control unit 30 performs the overall control of the mask fabrication apparatus 100, and includes at least an image generation part generating an image data by converting the output of secondary charged particle 40 as a secondary electron or a secondary ion each detected with the secondary charged particle detector 18 to luminance signal, and a display control part outputting the image data to the display unit 38. Owing to such configuration, the display unit 38 can display the image of the sample Wa as described above.

Additionally, the control unit 30 is equipped with an image processing part. The image processing part functions for carrying out the image processing of the generated image data to recover the shape information of the sample Wa, extracting a defect for example by comparing the shape information with the normal shape information of the sample Wa, and generating the information about the defect such as defect type, position and dimension. The control unit 30 is therefore capable of analyzing the shape of the sample Wa before and after defect repair, utilizing the output of the secondary charged particle 40 generated on the irradiation of the ion beam 20A on the sample Wa.

Furthermore, the control unit 30 drives the sample stage 16 on the basis of an order from the software or an input by an operator to adjust the position or posture of the sample Wa. In such configuration, the control unit 30 is capable of adjusting the position of the ion beam 20A for irradiation on the sample surface.

First Embodiment

The method for fabricating an EUVL mask using the mask fabrication apparatus described above is now described below.

Figure 3A:
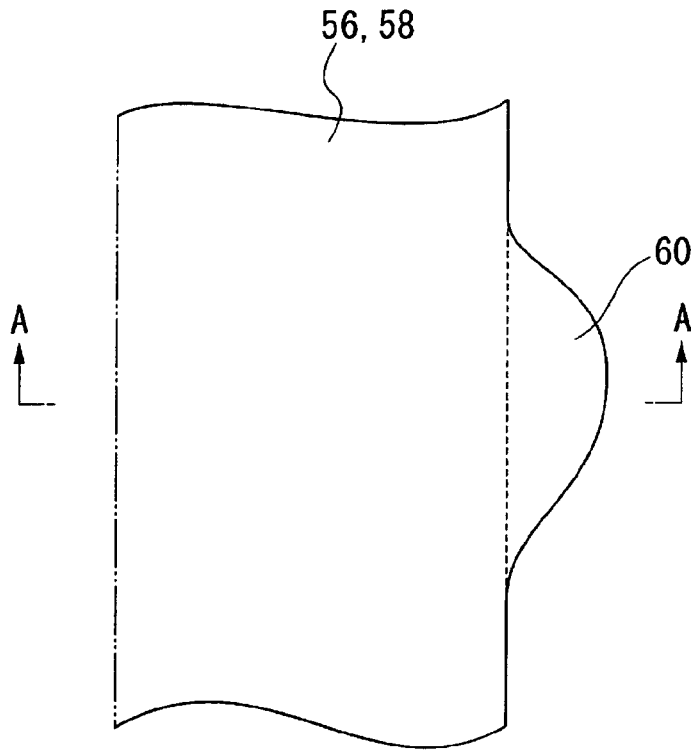
FIG. 3A is a partial plan view of an EUVL mask.
Figure 3B:
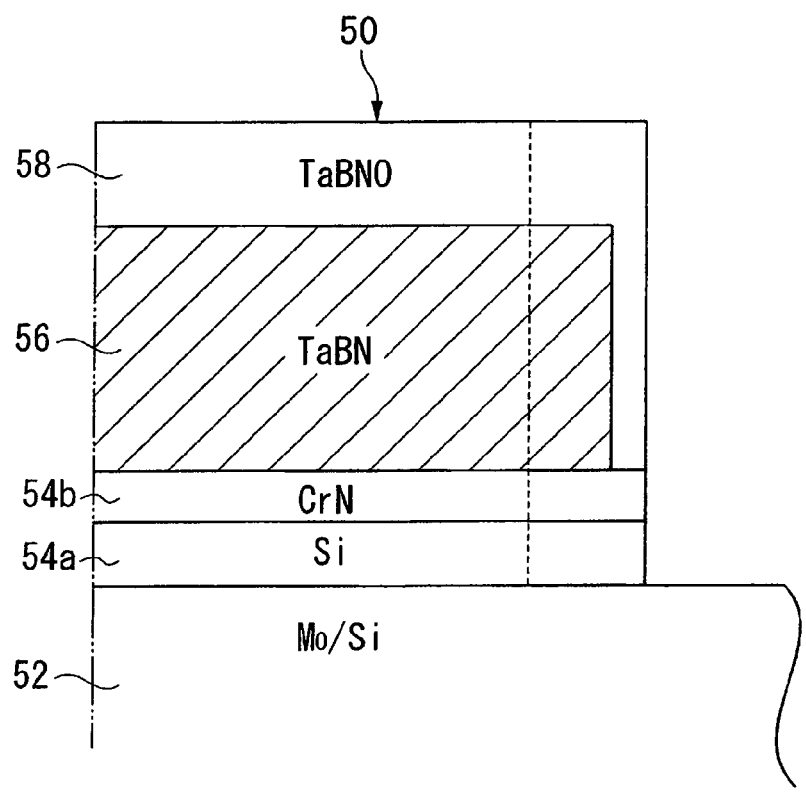
FIG. 3B is a cross-sectional view of the side face along the line A-A in FIG. 3A.

FIGS. 3A and 3B are explanatory views of the EUVL mask, where FIG. 3A is a partial plane view and FIG. 3B is the cross-sectional view of the side face along the line A-A in FIG. 3A. As shown in FIG. 3B, EUVL mask 50 includes reflection layer 52 reflecting EUV beam as formed on the whole surface of a substrate such as quartz (not shown in the figure), Si capping layer 54a formed in a given pattern on the surface of the reflection layer 52, a buffer layer 54b and an absorption layer 56. The reflection layer 52 is prepared by laminating alternately an Mo layer of about 4 nm and an Si layer of about 3 nm to about 40 layers.

On the surface of the reflection layer 52, the Si capping layer 54a and the buffer layer 54b including CrN are formed. On the surface of the buffer layer 54b, absorption layer 56 is formed. The absorption layer 56 is composed of a Ta compound such as TaBN and TaGeN absorbing EUV beam. So as to stabilize the surface (and side face) of the absorption layer 56, oxidized layer 58 is formed on the surface (and side face) of the absorption layer 56. Herein, the Si capping layer is formed in a thickness of about 10 nm; the CrN buffer layer 54b is formed in a thickness of about 10 to 20 nm; the absorption layer 56 is formed in a thickness of about 40 to 50 nm; and the oxidized layer is formed in a thickness of about 20 to 30 nm.

When an EUV beam at a wavelength of 13.5 nm irradiates the EUVL mask 50, the EUV beam is absorbed in the zone where the absorption layer 56 and the oxidized layer 58 are formed, while the EUV beam is reflected on the zone where the reflection layer 52 is exposed. By allowing the reflected EUV beam to irradiate a resist, the resist can be exposed into a given pattern.

Method for Fabricating EUVL Mask

As shown in FIG. 3A, meanwhile, black defect 60 may sometimes be formed when the absorption layer 56 and the oxidized layer 58 are shift from a given pattern. By lithography using such EUVL mask, the EUV beam is never reflected on the black defect 60, so that the resulting pattern on the exposed wafer is shift from the design value, leading to the deterioration or poor performance of the device profile. When the shift is large, electrical wiring may fall into a short circuit or may come down. Using the mask fabrication apparatus described above, therefore, a fabrication for black defect elimination is carried out.

On the sample table 14 in the vacuum chamber 13 in the mask fabrication apparatus as shown in FIG. 1, first, an EUVL mask as the sample Wa is placed. Subsequently, the pressure in the inside of the vacuum chamber 13 is reduced.

Then, an observation step for collecting the defect information of the EUVL mask is done. At the observation step, ion beam 20A at an output involving almost no occurrence of etching irradiates the EUVL mask from the ion beam irradiation system 20, at a state where the gas feed from the gas gun 11 is stopped. In such manner, secondary charged particle 40 is radiated from the absorption layer of the EUVL mask as shown in FIG. 2, and the released secondary charged particle 40 is detected with the secondary charged particle detector 18.

The control unit 30 collects the image data of the EUVL mask, based on the state of the secondary charged particle detected with the secondary charged particle detector 18. The control unit 30 can gain defect information including position and size information of black defect, by comparing the image data with the image data of the absorption layer pattern formed on the normal EUVL mask.

Additionally, the image data is enlarged and displayed on display unit 38. Therefore, an operator of the mask fabrication apparatus 100 can observe the black defect and the appearance of the vicinity thereof through the display unit 38.

Then, the defect repair step for eliminating the black defect of the EUVL mask is carried out.

Figure 4A:
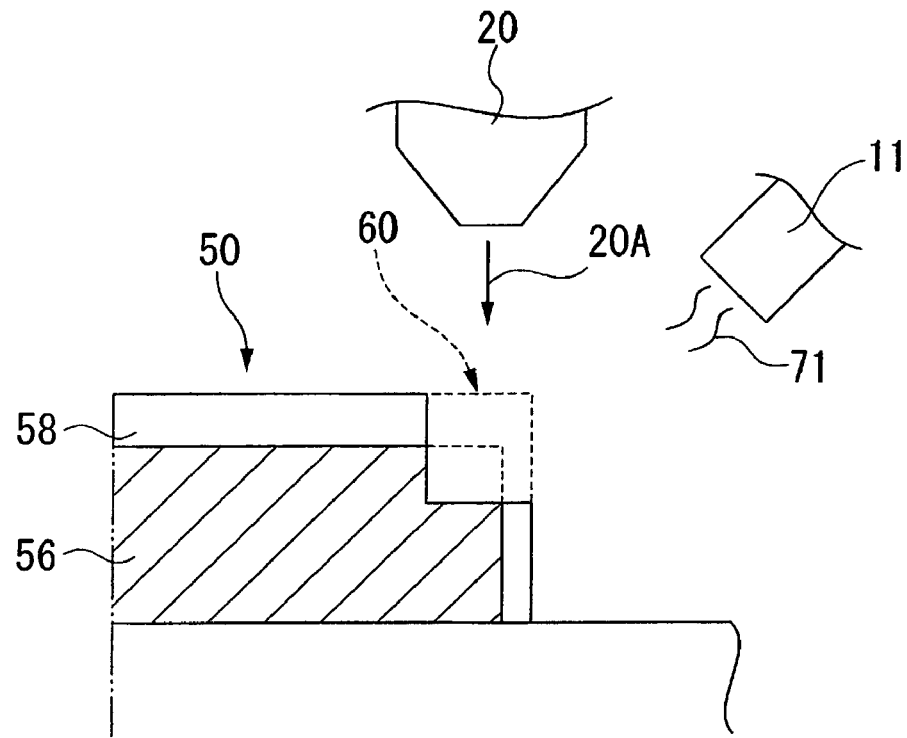
FIGS. 4A and 4B are views showing a black defect repair step in the method for fabricating an EUVL mask in First Embodiment.

FIGS. 4A, 4B, 5A and 5B are step views depicting the black defect repair step in the method for fabricating an EUVL mask in accordance with this embodiment. For more easy understanding of the figures, the Si capping layer and the buffer layer of the EUVL mask are not shown in FIGS. 4A, 4B, 5A and 5B. As shown in FIG. 4A, first, etching assist gas 71 is fed from the gas gun 11, while the irradiation of ion beam 20A from the ion beam irradiation system 20 is done for etching the black defect 60 (first etching step).

Etching assist gas (simply referred to as ôassist gasö hereinafter) 71 is a gas capable of etching the Ta compounds composing the absorption layer 56, and as such, halogen-series gases such as xenon fluoride (XeF2) and chloride (Cl2) may be selected. In this embodiment, xenon fluoride gas is used as the assist gas. Because the feed of the assist gas can improve the etching rate, the over-etching of the reflection layer of the EUVL mask with ion beam 20A can be prevented.

Additionally, the ion beam 20A irradiates only the zone of the black defect 60 by applying an accelerating voltage of 10 to 30 kV. If necessary, the entirety of the black defect 60 is irradiated with the ion beam 20A while the position of the ion beam 20A for irradiation is moving.

At the first etching step, the oxidized layer 58 and the absorption layer 56 are etched through the interaction between the physical etching with the ion beam 20A and the chemical etching with the assist gas 71. Herein, the oxidized layer 58 on the upper face is eliminated to expose the absorption layer 56. The physical etching with the ion beam 20A is anisotropic etching, while the chemical etching with the assist gas is isotropic etching. In total, the anisotropic etching is overwhelming. Therefore, only the oxidized layer 58 on the upper face of the absorption layer 56 is eliminated, so that the oxidized layer on the side face remains.

Figure 7A:
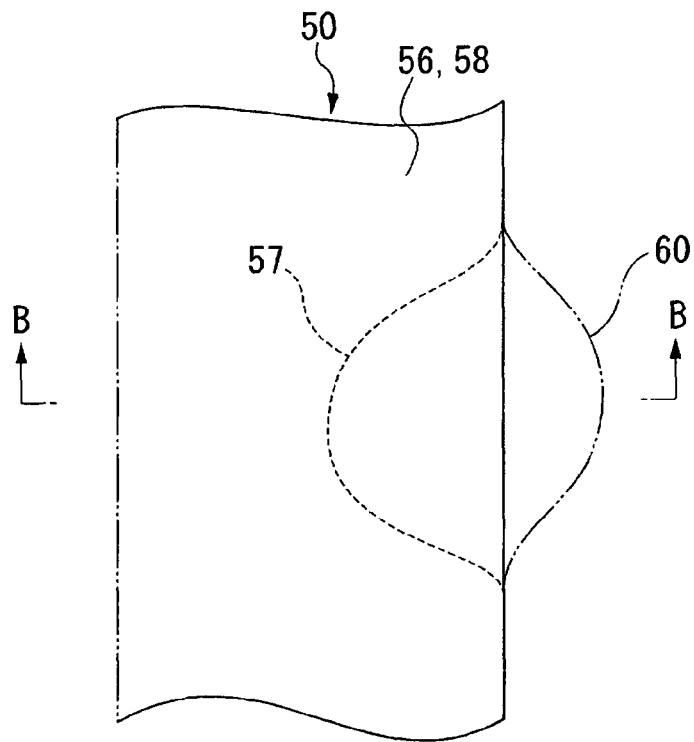
FIGS. 7A and 7B are views showing a black defect repair step in the method for fabricating an EUVL mask in accordance with the conventional technique.
Figure 7B:
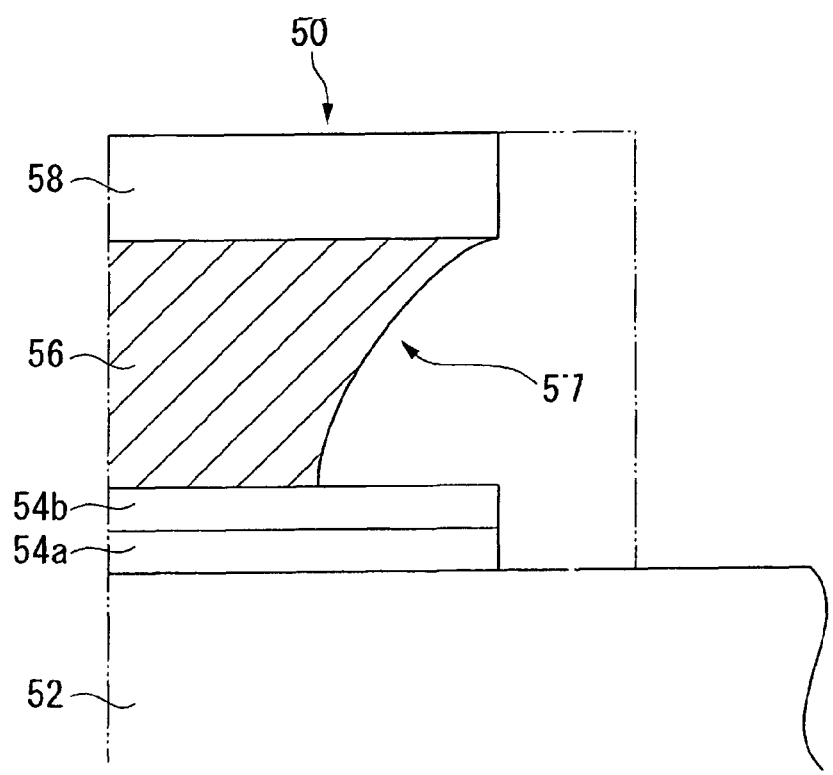

At the first etching step, further, the absorption layer 56 is etched to exposure the side face. As described above, the chemical etching with the assist gas 71 is isotropic etching. When the first etching step is continued for a long period of time, therefore, the exposed side face of the absorption layer 56 is side-etched. Consequently, undercut 57 as shown in FIG. 7B is eventually generated. Thus, the first etching step is terminated at the stage when a part of the absorption layer 56 is etched in this embodiment. As described above, the first etching step is done for such a short period of time that the side etching of the side face of the absorption layer 56 as freshly exposed can be progressed at minimum.

Figure 4B:
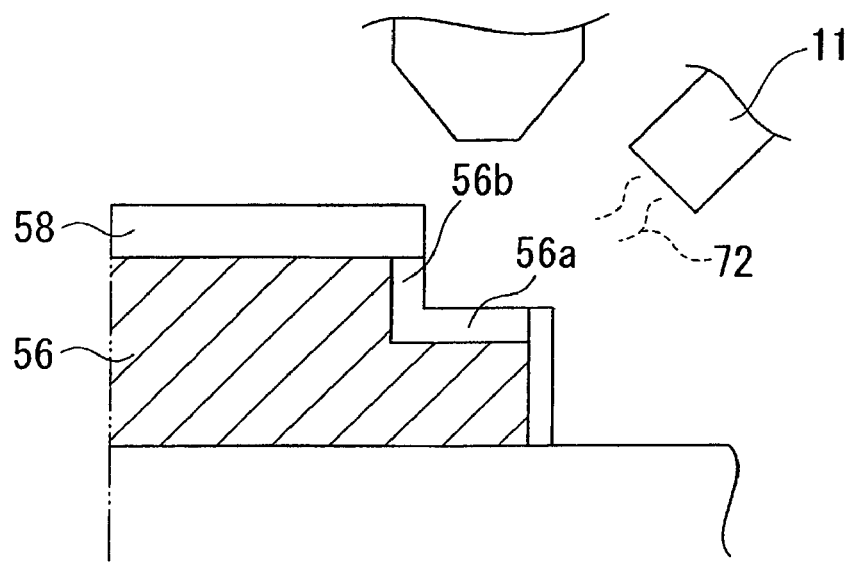

As shown in FIG. 4B, subsequently, oxidant gas 72 is fed from the gas gun 11 (first oxidant feed step). The oxidant gas is a gas containing an oxygen atom, preferably a gas containing hydroxyl group. As such oxidant gas, water (H2O) is used in this embodiment. As a material containing hydroxyl group, alcohol may be used. Since the pressure in the inside of the vacuum chamber is reduced, liquid water when fed into the vacuum chamber immediately vaporizes into steam. Herein, no irradiation of any ion beam is done at the first oxidant feed step.

At the first oxidant feed step, at least the side face of the absorption layer 56 among the freshly exposed faces of the absorption layer 56 is oxidized with the oxidant gas 72. Specifically, the side face of the absorption layer 56 is oxidized to form a side face-oxidized layer 56b, while the upper face of the absorption layer 56 is concurrently oxidized to form an upper face-oxidized layer 56a.

Figure 5A:
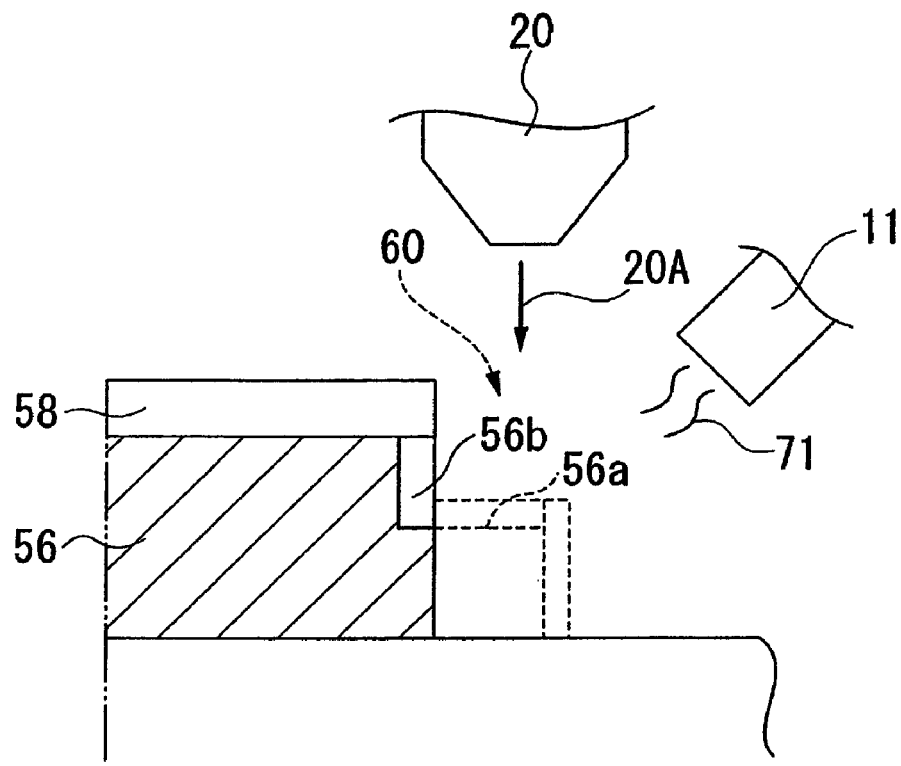
FIGS. 5A and 5B are views showing a black defect repair step in the method for fabricating an EUVL mask in First Embodiment.

By subsequently feeding the assist gas 71 from the gas gun 11 and concurrently progressing the irradiation of the ion beam 20A from the ion beam irradiation system 20, the black defect 60 is etched (second etching step), as shown in FIG. 5A. The specific contents thereof are the same as those of the first etching step. Since the anisotropic etching is overwhelming even at the second etching step, the upper face-oxidized layer 56a is eliminated while the side face-oxidized layer 56b remains, so that the upper face of the absorption layer 56 is exposed.

At the second etching step, further, the absorption layer 56 is etched. Herein, the assist gas 71 has such an etching selectivity for the oxidized layer and the absorption layer that the etching rate of the absorption layer is larger than the etching rate of the oxidized layer. Since the side face-oxidized layer 56b is formed on the upper half part of the absorption layer 56, only the upper face of the lower half part can be etched without the side etching of the side face on the upper half part. By carrying out the second etching step for a short period of time like the first etching step, side etching of the side face on the lower half part of the absorption layer 56 as freshly exposed can be progressed at minimum.

Figure 5B:
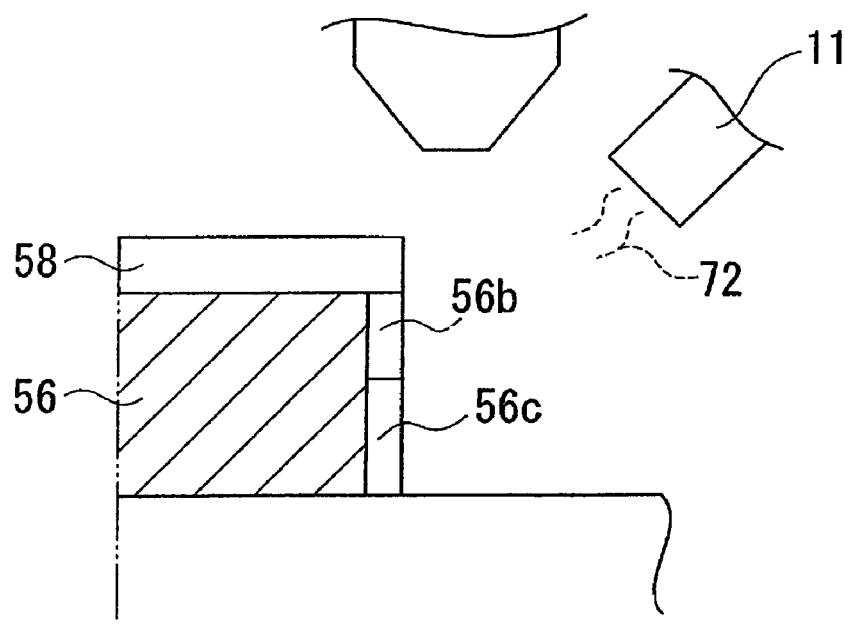

As shown in FIG. 5B, then, irradiation of oxidant gas 72 from the gas gun 11 is done (second oxidant feed step). The specific contents thereof are the same as those of the first oxidant feed step. At the second oxidant feed step, at least the side face of the absorption layer 56 among the freshly exposed faces of the absorption layer 56 is oxidized with the oxidant gas 72, to form a side face-oxidized layer 56c.

As described above, the etching step and the oxidant feed step are alternately carried out at plural times. For example, the etching step and the oxidant feed step are alternately carried out, each step for one minute.

In this embodiment, the black defect is totally eliminated at the first and second etching steps. However, preferably, the black defect is eliminated through more etching steps. It is needless to say that even in this case, the etching step and the oxidant feed step are alternately carried out. In such manner, single etching step can be done for an extremely short time, to prevent the side etching of the side face of the absorption layer 56 as freshly exposed.

Additionally, the oxidant feed step is preferably carried out after the final etching step. As shown in FIG. 5B, the side face-oxidized layers 56b, 56c can thus be formed on the whole side face of the absorption layer 56 from which the black defect is preliminarily eliminated, to suppress the side etching with xenon fluoride by protecting the absorption layer 56 with the oxidized layers with resistance to xenon fluoride.

As described above in detail, the method for fabricating an EUVL mask in this embodiment shown in FIGS. 4A and 4B includes an etching step of etching black defect 60 of absorption layer 56 by the irradiation of ion beam under feed of xenon fluoride and a subsequent oxidant feed step of feeding oxidant gas 72 to the absorption layer 56, and the etching step and the oxidant feed step are carried out alternately at plural times.

According to the configuration, a side face-oxidized layer 56b can be formed at the oxidant feed step on the side face of the absorption layer 56 as freshly exposed at the etching step. Herein, xenon fluoride gas has an etching selectivity for the absorption layer and oxidized layer of the EUVL mask. Additionally, the physical etching with ion beam is anisotropic etching, while the chemical etching with xenon fluoride gas is isotropic etching, so that the anisotropic etching is overwhelming in total. At the next etching step, therefore, the upper face of the absorption layer 56 can be etched while the side face-oxidized layer 56b of the absorption layer 56 can be left as it is. By carrying out the etching step and the oxidant feed step alternately at plural times, additionally, single such etching step can be done for a short time. In such manner, the side etching of the side face of the absorption layer 56 as freshly exposed at each etching step can be progressed at minimum. By the manner described above, the side etching of the absorption layer 56 can be suppressed, to fabricate the patter of the absorption layer 56 at a high precision.

This embodiment, in particular, is configured to feed xenon fluoride gas 71 and oxidant gas 72 separately at the etching step and the oxidant feed step, respectively. According to the configuration, oxidant gas 72 decomposing xenon fluoride gas 71 can be selected, when these gases are supplied simultaneously. For example, substances with hydroxyl group, such as water and alcohol, decompose xenon fluoride gas 71 when the substances are fed simultaneously with the gas. Because the substances with hydroxyl group deposit topically on the absorption layer 56 to exert the oxidizing action, however, a very small amount of the substances can function as such oxidant. In this embodiment, such oxidant gas 72 is used to form the side face-oxidized layer 56b on the side face of the absorption layer 56 in a secure manner. Accordingly, the side etching of the absorption layer 56 can be suppressed, to fabricate the pattern of the absorption layer 56 at an extremely high precision.

Second Embodiment

A method for fabricating an EUVL mask in Second Embodiment is now described. Second Embodiment is different from First Embodiment in that an oxidant is fed simultaneously with xenon fluoride gas at the etching step. The parts with the same configuration in the First Embodiment are not described in detail.

Figure 6A:
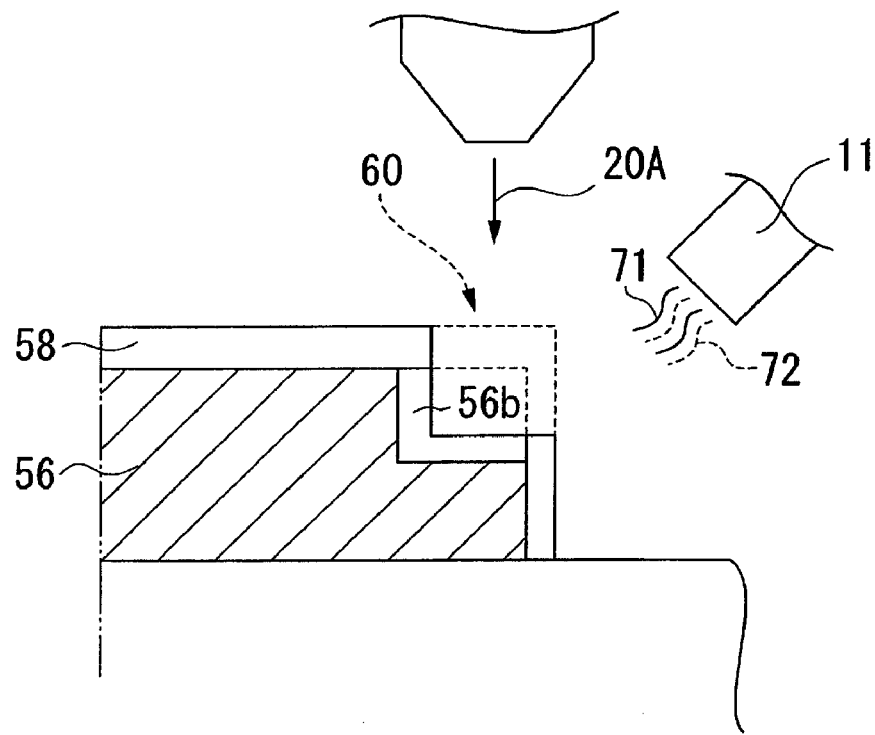
FIGS. 6A and 6B are views showing a black defect repair step in the method for fabricating an EUVL mask in Second Embodiment.
Figure 6B:
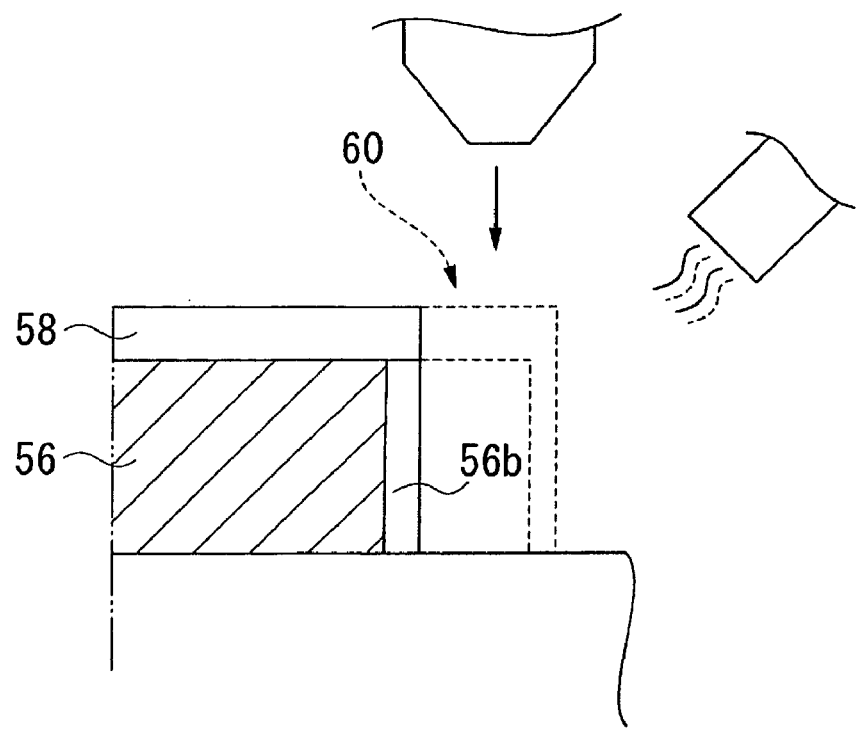

FIGS. 6A and 6B are views showing the black defect repair step of the method for fabricating an EUVL mask in Second Embodiment. For easy understanding of FIGS. 6A and 6B, the Si capping layer and the buffer layer in the EUVL mask are not described in the figure. As shown in FIG. 6A, the etching step is carried out by etching black defect 60 on the absorption layer 56 and the oxidized layer 58 via the irradiation of ion beam 20A under feed of xenon fluoride gas 71 at the black defect repair step. Following the oxidized layer 58, herein, the absorption layer 56 is etched.

At the etching step, oxidant gas 72 is fed together with xenon fluoride gas 71 from gas gun 11. The oxidant gas 72 is a gas containing an oxygen atom and generating active oxygen via the irradiation of the ion beam 20A. Additionally, it is required that the oxidant gas 72 never decomposes xenon fluoride because the oxidant gas 72 is fed together with xenon fluoride. As such oxidant gas, ozone gas ($O_3$) is selected in this embodiment. Further, oxygen gas activated with remote plasma may also be fed. In such manner, the etching of the upper face of the absorption layer 56 can be progressed while the side face-oxidized layer 56b is formed on the side face of the absorption layer 56 as freshly exposed. In other words, the side face of the absorption layer 56 can be protected constantly with the side face-oxidized layer 56b, so that the side etching of the side face of the absorption layer 56 can be prevented in a secure manner.

By carrying out the etching step consistently, the black defect 60 is totally eliminated as shown in FIG. 6B. The etching step can be terminated at a state where the side face-oxidized layer 56b is formed on the whole side face of the absorption layer 56.

As described above in detail, the method for fabricating an EUVL mask in this embodiment shown in FIGS. 6A and 6B is configured to include an etching step of etching black defect 60 of absorption layer 56 by the irradiation of ion beam 20A under feed of xenon fluoride gas 71, where the oxidant gas 72 is fed together with the xenon fluoride gas 71 at the etching step.

According to the configuration, the side face of the absorption layer 56 can be protected constantly with the side face-oxidized layer 56b when the upper face of the absorption layer 56 is etched, so that the side etching of the side face of the absorption layer 56 can be prevented in a secure manner. In such manner, the pattern of the absorption layer 56 can be fabricated at an extremely high precision. Compared with the case of alternately feeding the xenon fluoride gas 71 and the oxidant gas 72, the fabrication step can be simplified.

The technical scope of the invention is not limited to those embodiments described above. Without departing from the spirit and scope of the invention, various modifications of the embodiments described above may also be encompassed. Specifically, the specific materials and layer constitutions listed in the embodiments are simple examples. Various appropriate modifications may also be possible.

In the embodiments, ion beam is used as a charged particle beam for the irradiation of an EUVL mask. However, electron beam may also be selected.

What is claimed is:

1. A method for fabricating an extreme ultraviolet lithography (EUVL) mask comprising:
    an etching step of etching at least a part of an absorption layer of an EUVL mask by allowing a charged particle to irradiate the absorption layer under feed of a halogenated xenon gas; and
    an oxidant feed step of feeding an oxidant to the absorption layer after the etching step to form an oxidized layer at a side surface of the absorption layer that is not etched during the etching step.

2. A method for fabricating an EUVL mask according to claim 1; wherein the oxidant is water.

3. A method for fabricating an extreme ultraviolet lithography (EUVL) mask comprising: etching at least a part of an absorption layer of an EUVL mask by allowing a charged particle beam to irradiate the absorption layer under feed of a halogenated xenon gas and while feeding together with the halogenated xenon gas an oxidant to form an oxidized layer at a side surface of the absorption layer that is not etched.

4. A method for fabricating an EUVL mask according to claim 3; wherein the oxidant is ozone gas.

5. A method for fabricating an EUVL mask according to claim 1; further comprising the steps of alternately repeating for a plurality of times the etching step and the oxidant feed step.

6. A method of repairing an extreme ultraviolet lithography (EUVL) mask formed with an absorption layer having a defect, comprising the steps of:
    etching a zone of the absorption layer corresponding to the defect by irradiating the zone with a charged particle beam under feed of a halogenated xenon gas; and
    feeding an oxidant to the absorption layer to form an oxidized layer at a side surface of the absorption layer that is not etched during the etching step.

7. A method according to claim 6; wherein the step of feeding the oxidant comprises feeding the oxidant after the etching step.

8. A method according to claim 7; wherein the oxidant is water.

9. A method according to claim 6; wherein the oxidant is water.

10. A method according to claim 6; wherein the step of feeding the oxidant comprises feeding the oxidant together with the halogenated xenon gas.

11. A method according to claim 10; wherein the oxidant is ozone gas.

* * * * *

UNITED STATES PATENT AND TRADEMARK OFFICE
CERTIFICATE OF CORRECTION

| | | |
|---|---|---|
| PATENT NO. | : 7,927,769 B2 | |
| APPLICATION NO. | : 12/380872 | |
| DATED | : April 19, 2011 | |
| INVENTOR(S) | : Ryoji Hagiwara et al. | |

It is certified that error appears in the above-identified patent and that said Letters Patent is hereby corrected as shown below:

IN THE HEADING, ITEM (73)
"SII Nanotechnology Inc." should read --SII NanoTechnology Inc.--

Signed and Sealed this
Ninth Day of August, 2011

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,927,769 B2 |
| APPLICATION NO. | : 12/380872 |
| DATED | : April 19, 2011 |
| INVENTOR(S) | : Ryoji Hagiwara et al. |

It is certified that error appears in the above-identified patent and that said Letters Patent is hereby corrected as shown below:

Title Page, ITEM (73) Assignee
"SII Nanotechnology Inc." should read --SII NanoTechnology Inc.--

This certificate supersedes the Certificate of Correction issued August 9, 2011.

Signed and Sealed this
Thirtieth Day of August, 2011

David J. Kappos
*Director of the United States Patent and Trademark Office*